United States Patent
Kantarovsky et al.

(10) Patent No.: US 10,217,826 B2
(45) Date of Patent: Feb. 26, 2019

(54) APPARATUS OF A METAL-OXIDE-SEMICONDUCTOR (MOS) TRANSISTOR INCLUDING A MULTI-SPLIT GATE

(71) Applicant: Tower Semiconductor Ltd., Migdal Haemek (IL)

(72) Inventors: Johnatan A. Kantarovsky, Zicron Ya'akov (IL); Sharon Levin, Haifa (IL); David Mistele, Haifa (IL); Sagy Levy, Zicron Ya'akov (IL)

(73) Assignee: TOWER SEMICONDUCTOR LTD., Migdal Haemek (IL)

( * ) Notice: Subject to any disclaimer, the term of this patent is extended or adjusted under 35 U.S.C. 154(b) by 125 days.

(21) Appl. No.: 15/356,601

(22) Filed: Nov. 20, 2016

(65) Prior Publication Data
US 2018/0145139 A1 May 24, 2018

(51) Int. Cl.
*G05F 1/10* (2006.01)
*H01L 29/40* (2006.01)
*H01L 29/78* (2006.01)
*H01L 29/10* (2006.01)
*G05F 3/02* (2006.01)

(52) U.S. Cl.
CPC .......... *H01L 29/402* (2013.01); *G05F 3/02* (2013.01); *H01L 29/1095* (2013.01); *H01L 29/7816* (2013.01); *H01L 29/7831* (2013.01)

(58) Field of Classification Search
CPC ......... H01L 2924/0002; H01L 2924/00; H01L 29/785; H01L 29/7869
See application file for complete search history.

(56) References Cited

U.S. PATENT DOCUMENTS

| | | | | |
|---|---|---|---|---|
| 2002/0196098 A1* | 12/2002 | Sasabata | ............... | H03H 11/245 333/81 R |
| 2006/0039173 A1* | 2/2006 | Noda | ..................... | G11C 15/04 365/49.17 |
| 2009/0268538 A1* | 10/2009 | Fukushima | ............. | G05F 3/262 365/208 |
| 2010/0171179 A1* | 7/2010 | Liu | ..................... | H01L 29/8124 257/365 |
| 2010/0171659 A1* | 7/2010 | Waters | .................... | G01S 19/34 342/357.74 |
| 2015/0041889 A1* | 2/2015 | Sun | ..................... | H01L 29/7813 257/331 |
| 2015/0061008 A1 | 3/2015 | McGregor et al. | | |

FOREIGN PATENT DOCUMENTS

EP 1170803 9/2002

* cited by examiner

*Primary Examiner* — Sibin Chen
(74) *Attorney, Agent, or Firm* — Shichrur & Co.

(57) ABSTRACT

Some demonstrative embodiments include a Metal-Oxide-Semiconductor (MOS) transistor including a multi-split gate. For example, an Integrated Circuit (IC) may include at least one MOS transistor, the MOS transistor may include a source; a drain; a body; and a multi-split gate including a control gate component configured to control conductivity of the MOS transistor, and at least first and second field plate gate components, the first field plate gate component is electrically isolated from the second field plate gate component, the first and second field plate gate components are electrically isolated from the control gate.

23 Claims, 10 Drawing Sheets

APPARATUS OF A METAL-OXIDE-SEMICONDUCTOR (MOS) TRANSISTOR INCLUDING A MULTI-SPLIT GATE

TECHNICAL FIELD

Embodiments described herein generally relate to a Metal-Oxide-Semiconductor (MOS) transistor including a multi-split gate.

BACKGROUND

A Power Management Integrated Circuit (PMIC) is configured to manage power of an electronic circuit.

The PMIC may include one or more Metal-Oxide-Semiconductor (MOS) transistors.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
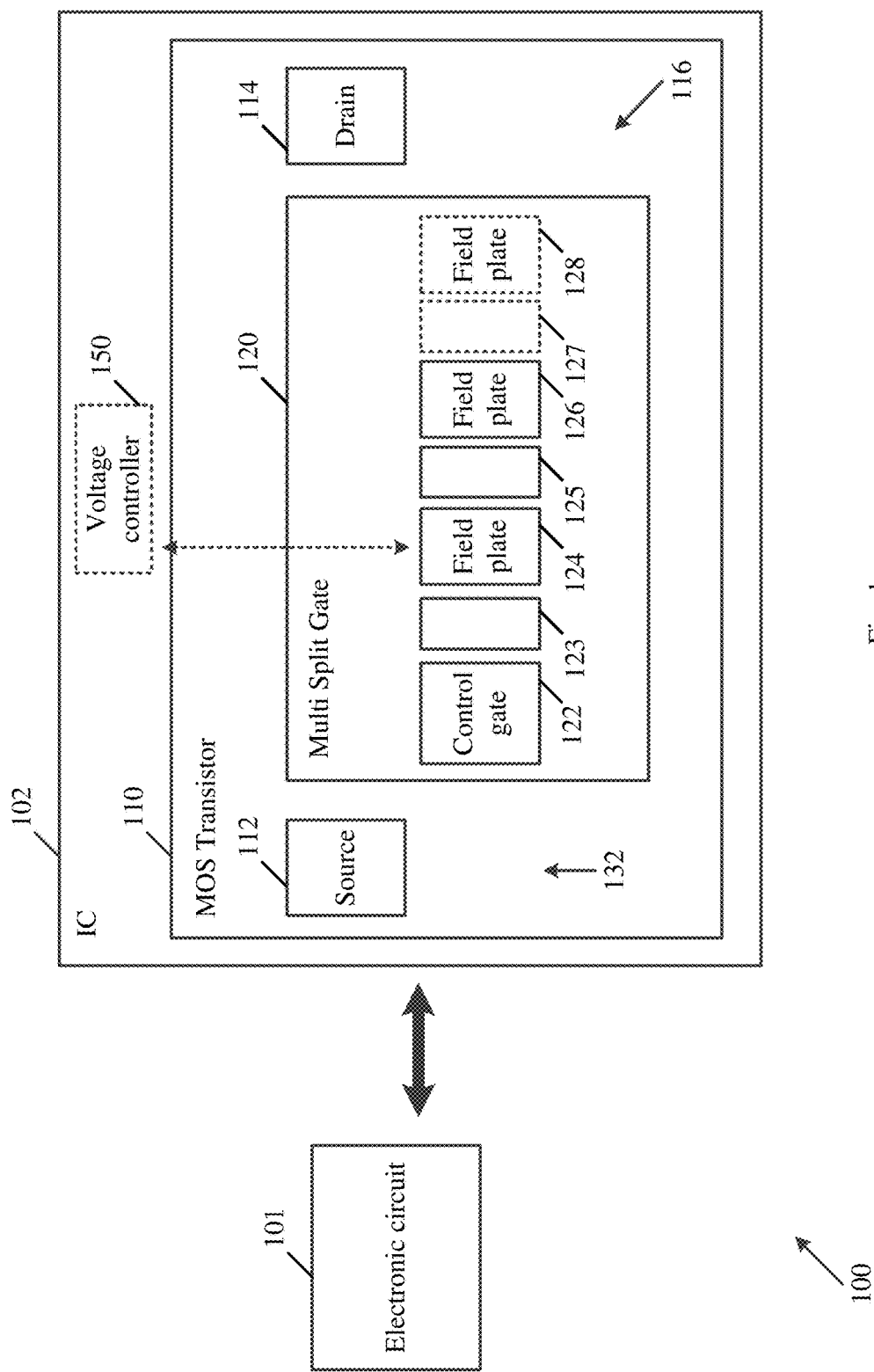
FIG. 1 is a schematic block diagram illustration of an apparatus, in accordance with some demonstrative embodiments.

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one embodiment", "an embodiment", "demonstrative embodiment", "various embodiments" etc., indicate that the embodiment(s) so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

Some embodiments may be used in conjunction with various devices and systems, for example, an electronic device, a computing device, an integrated computing device, an integrated chip, electronic circuitry, a processing device, an electrical device, a processor, a memory device, an imaging device, a digital camera device, a video device, a camera module, a medical imaging device, a mobile computer, a laptop computer, a notebook computer, a tablet computer, a handheld computer, a handheld device, a Personal Digital Assistant (PDA) device, a handheld PDA device, a mobile or portable device, a consumer device, a Smartphone and the like.

The terms "substrate" and/or "wafer", as used herein, may relate to a thin slice of semiconductor material, for example, a silicon crystal, which may be used in fabrication of integrated circuits and/or any other microelectronic devices. For example, the wafer may serve as the substrate for the microelectronic devices, which may be built in and over the wafer.

The term "Integrated Circuit" (IC), as used herein, may relate to a set of one or more electronic circuits on a semiconductor material. For example, the electronic circuit may include electronic components and their interconnectors.

Reference is made to FIG. 1, which schematically illustrates a block diagram of an apparatus 100, in accordance with some demonstrative embodiments.

In some demonstrative embodiments, apparatus 100 may include an electronic circuit 101.

In one example, electronic circuit 101 may include, may be part of, and/or may be implemented as part of, a memory, a processor, a controller, and/or any other electronic circuit.

In some demonstrative embodiments, apparatus 100 may include an Integrated Circuit (IC) 102 configured to manage power of one or more components of electronic circuit 101.

In some demonstrative embodiments, IC 102 may include a metal-oxide-semiconductor (MOS) IC formed on a wafer.

In some demonstrative embodiments, IC 102 may include a power management integrated circuit (PMIC) configured to manage the power of one or more components of electronic circuit 101.

In some demonstrative embodiments, IC 102 may be included, and/or may be implemented as part of electronic circuit 101.

In one example, apparatus 100 may include a System on Chip (SoC), which may be formed on the wafer. For example, the SoC may be configured to perform one or more functionalities of electronic circuit 101 and/or IC 102.

In some demonstrative embodiments, IC 102 and electronic circuit 101 may be implemented as separate elements of apparatus 100.

In one example, apparatus 100 may include an electronic circuit board including IC 102 and electronic circuit 101, which may be connected using one or more interconnectors, tracers, and/or wires.

In some demonstrative embodiments, IC 102 may include at least one MOS transistor 110.

In some demonstrative embodiments, MOS transistor 110 may include a source 112, a drain 114, and a body 116.

In one example, the drain 114 may be connected to a drain voltage supply (VDD), and/or the source 112 and/or body 116 may be connected to a source supply voltage (VSS).

In another example, the source 112 and/or body 116 may be connected to any other bias voltage.

In some demonstrative embodiments, body 116 may include a P-type body, e.g., as described below.

In other embodiments, body 116 may include an N-type body.

In some demonstrative embodiments, MOS transistor 110 may include a lateral Double-Diffused MOS (DMOS), e.g., as described below.

In some demonstrative embodiments, MOS transistor 110 may include a vertical DMOS.

In other embodiments, MOS transistor 110 may include any other type of MOS transistor.

In some demonstrative embodiments, MOS transistor 110 may include a multi-split gate 120, e.g., as described below.

In some demonstrative embodiments, multi-split gate 120 may be implemented in a PMIC, e.g., IC 110, for example, at least to reduce a gate to drain capacitance (Cgd) of MOS transistor 110, e.g., between multi-split gate 120 and drain 114.

In one example, multi-split gate 120 may reduce the Cgd of MOS transistor 110, for example, compared to a MOS transistor having a unified or "non-split" gate ("unified gate MOS transistor").

In some demonstrative embodiments, reducing the gate to drain capacitance may enable, for example, to achieve reduced switching losses of MOS transistor 110.

In some demonstrative embodiments, a MOS transistor including a split gate having only two gates ("two-gate-component MOS transistor") may have one or more disadvantages, e.g., as described below. For example, the two-gate-component MOS transistor may include a gate which is divided into two parts, for example, a first gate for switching an inversion channel between an On-state and an Off-state of the MOS transistor, and a second gate as a filed plate, which may be connected to a constant voltage, e.g., a bias voltage, or may be switched between the On-state and the Off-state of the MOS transistor.

In a first example, the two-gate-component MOS transistor may impose an equipotential along and under the first and second components.

In a second example, there may be a tradeoff between a gate to drain capacitance of the two-gate-component MOS transistor, a resistance (Rdson) between a drain and a source during the On-state of the two-gate-component MOS transistor, and a breakdown voltage (BV), e.g., a drain-source breakdown voltage (BVdss), of the two-gate-component MOS transistor, e.g., as described below.

For example, switching losses of the two-gate-component MOS transistor may increase, for example, if the second gate is switched between the On-state and the Off-state.

For example, conduction losses of the two-gate-component MOS transistor may increase, for example, if the second gate is connected to a VSS, and/or the BVdss of the two-gate-component MOS transistor may decrease, for example, if the second gate is connected to a VDD.

In a third example, the second gate may impose a same potential over an accumulation area and a depletion area of the two-gate-component MOS transistor.

In some demonstrative embodiments, multi-split gate 120 may be configured to provide one or more improved performance characteristics, e.g., compared to a performance of the two-gate-component MOS transistor, e.g., as described below.

In some demonstrative embodiments, multi-split gate 120 may be implemented, for example, to significantly reduce the switching losses, for example, while maintaining a reduced Rdson resistance and/or an increased BVdss voltage of the MOS transistor 110, e.g., as described below.

In some demonstrative embodiments, multi-split gate 120 may include a control gate component 122 configured to control conductivity of the MOS transistor 110, and at least first and second field plate gate components, e.g., including at least a first field plate gate component 124 and a second field plate gate component 126.

In some demonstrative embodiments, field plate gate component 124, field plate gate component 126, and/or the control gate component 122 may include three respective polysilicon or metal electrodes.

In some demonstrative embodiments, multi-split gate 120 may be configured to apply a suitable voltage for each gate component of the multi-split gate 120, for example, to optimize an electrostatic potential under each gate component of multi-split gate 120. For example, gate components 122, 124 and 126 may be biased statically or dynamically or may be floating, e.g., as described below.

In one example, a polysilicon electrode, e.g., gate component 122, 124 and/or 126, have a size of between 0.09 and 1 micrometer (µm), and/or any other size.

In one example, two adjacent polysilicon electrodes of multi-split gate 120 may be separated by a spacing of between 0.1 and 0.4 µm, and/or any other spacing. For example, a minimal size of the polysilicon electrodes and/or the space between two adjacent polysilicon electrodes may be limited, for example, by a fabrication technology.

In some demonstrative embodiments, field plate gate component 124 may be electrically isolated from field plate gate component 126.

In some demonstrative embodiments, field plate gate components 124 and/or 126 may be electrically isolated from control gate component 122. In some demonstrative embodiments, the control gate component 122 may be configured to control the conductivity of MOS transistor 110, for example, by creating a channel in an inversion region 132 of the MOS transistor 110.

In some demonstrative embodiments, the control gate component 122 may be over the inversion region 132 of the MOS transistor 110.

In some demonstrative embodiments, the control gate component 122 may be switched between an On-state and an Off-state, for example, to enable or disable conduction in the channel in the inversion region 132.

In some demonstrative embodiments, the control gate component 122 may be between the source 112 and the first field plate gate component 124.

In some demonstrative embodiments, the first field plate gate component 124 may be between the control gate component 122 and the second field plate gate component 126.

In some demonstrative embodiments, the second field plate gate component 126 may be between the first field plate gate component 124 and the drain 114.

In some demonstrative embodiments, MOS transistor 110 may include at least a first isolator 123 configured to electrically isolate between the first field plate component 124 and the control gate component 122.

In some demonstrative embodiments, MOS transistor 110 may include at least a second isolator 125 configured to electrically isolate between field plate gate components 124 and 126.

In one example, isolators 123 and/or 125 may include a spacer, which may be formed of an isolating material, for example, to electrically isolate between gate components 122, 124 and/or 126.

In some demonstrative embodiments, the at least first and second field plate gate components of multi-split gate 120 may be connected to one or more supply voltages, e.g., as described below.

In some demonstrative embodiments, first and second field plate gate components of multi-split gate 120 may be connected to a supply voltage, which may be a static bias, e.g., a bias between a Vcc and a Vdd, or a dynamic bias, e.g., as described below.

In some demonstrative embodiments, when the MOS transistor 110 is in a conducting state, e.g., in an On-state, the at least first and second field plate gate components may be biased, for example, to enable a reduced resistance, e.g., a reduced Rdson resistance, between drain 114 and source 112.

In some demonstrative embodiments, when the MOS transistor 110 is in a non-conducting state, e.g., in an Off-state, the at least first and second field plate gate components may be biased, for example, to enable an equal electric field distribution, which may result in an increased breakdown voltage, e.g., an increased BVdss voltage.

In some demonstrative embodiments, the at least first and second field plate gate components of multi-split gate 120 may be connected to one or more supply voltages, for example, according to a first implementation, e.g., as described below.

In some demonstrative embodiments, the first field plate gate component 124 may be connected to a predefined voltage, e.g., according to the first implementation.

In one example, first field plate gate component 124 may be connected to a constant power source, e.g., a five Volt (V) power source.

In another example, the first field plate gate component 124 may be connected to a constant power source different from 5V, e.g., a constant power source, which is lower than the breakdown voltage of MOS transistor 110.

In some demonstrative embodiments, the second field plate gate component 126 may be connected to the VSS voltage, e.g., according to the first implementation.

Figure 2:
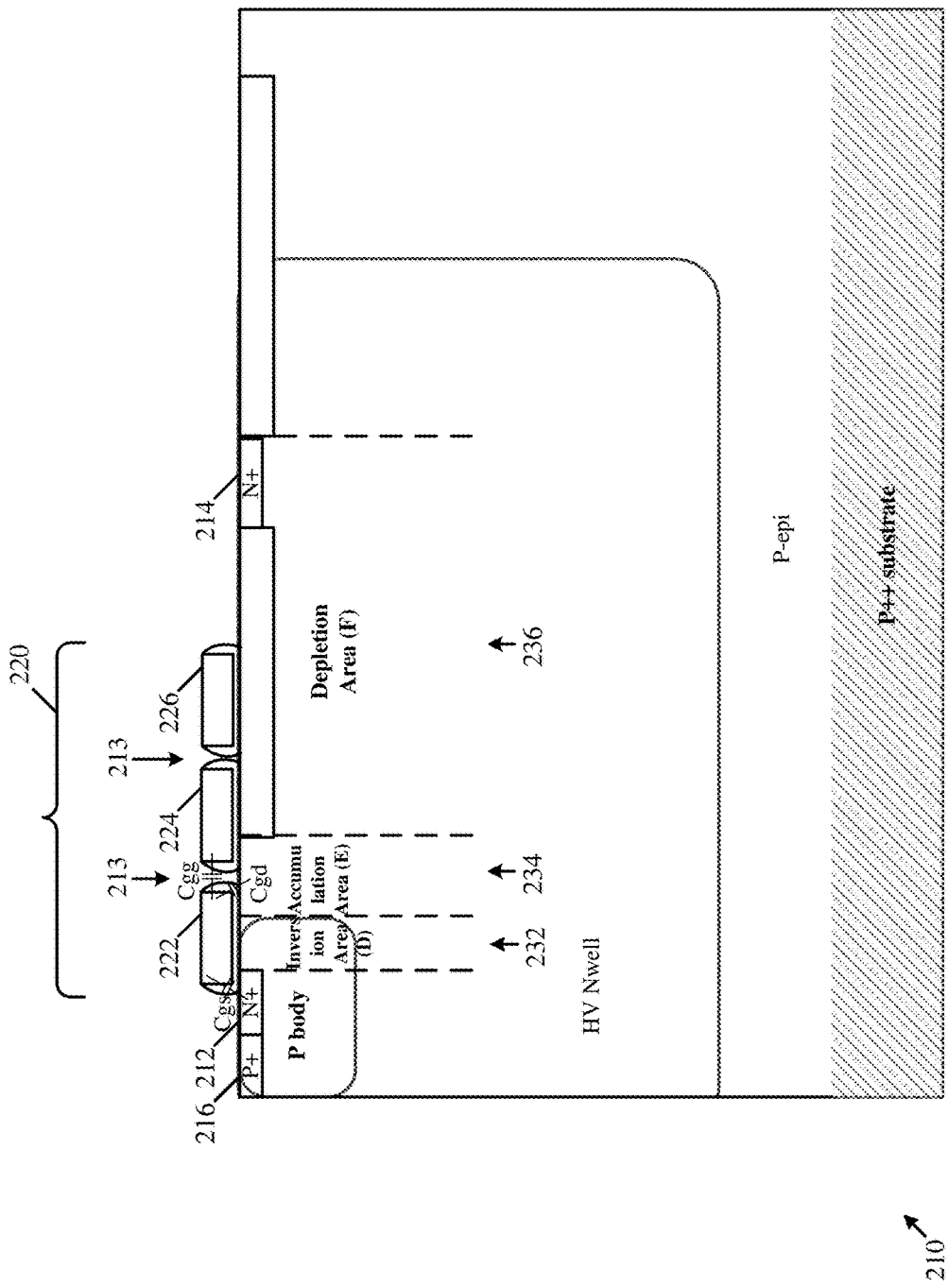
FIG. 2 is a schematic illustration of a cross section of a metal-oxide-semiconductor (MOS) transistor according to a first implementation, in accordance with some demonstrative embodiments.

Reference is made to FIG. 2, which schematically illustrates a cross section of a MOS transistor 210 according to a first implementation, in accordance with some demonstrative embodiments. For example, MOS transistor 210 may perform the functionality of MOS transistor 110 (FIG. 1).

In some demonstrative embodiments, as shown in FIG. 2, MOS transistor 210 may include a body 216, a source 212, a drain 214, and/or a multi-split gate 220. For example, body 216 may perform the functionality of body 110 (FIG. 1), source 212 may perform the functionality of source 112 (FIG. 1), drain 214 may perform the functionality of drain 114 (FIG. 1), and/or multi-split gate 220 may perform the functionality of multi-split gate 120 (FIG. 1), for example, according to the first implementation.

In some demonstrative embodiments, as shown in FIG. 2, multi-split gate 220 may include a control gate component 222 configured to control the conductivity of the MOS transistor 210, for example, by creating a channel in an inversion region 232 of the MOS transistor 210. For example, control gate component 222 may perform the functionality of control gate component 122 (FIG. 1).

In some demonstrative embodiments, as shown in FIG. 2, multi-split gate 220 may include a first field plate gate component 224 connected to a predefined voltage, e.g., a constant 5V power source. For example, first field plate gate component 224 may perform the functionality of first field plate gate component 124 (FIG. 1).

In some demonstrative embodiments, as shown in FIG. 2, first field plate gate component 224 may be over an accumulation area 234 of MOS transistor 210.

In some demonstrative embodiments, as shown in FIG. 2, multi-split gate 220 may include a second field plate gate component 224 connected to the VSS voltage. For example, second field plate gate component 226 may perform the functionality of second field plate gate component 126 (FIG. 1).

In some demonstrative embodiments, as shown in FIG. 2, second field plate gate component 224 may be over a depletion area 236 of MOS transistor 210.

In some demonstrative embodiments, as shown in FIG. 2, MOS transistor 210 may include two or more isolators 213 configured to electrically isolate between gate components 222, 224 and/or 226. For example, isolators 213 may perform the functionality of isolators 123 and/or 125 (FIG. 1).

In some demonstrative embodiments, MOS transistor 210 may provide one or more advantages, for example, in conductive and/or non-conductive states of MOS transistor 210, e.g., as described below.

In some demonstrative embodiments, when MOS transistor 210 is in the conductive state, e.g., in an On-state, for example, the first field plate gate component 224, which is biased at 5V, may enable to accumulate charge carriers, for example, over the accumulation area 234, which may reduce the resistance, e.g., the Rdson resistance, between drain 214 and source 212.

In some demonstrative embodiments, when MOS transistor 210 is in the non-conductive state, e.g., at the Off-state, for example, the first field plate gate component 224, which is biased at 5V, and the second field plate gate component 226, which is connected to the VSS voltage, may enable an increased breakdown voltage of MOS transistor 210, e.g., an increased BVdss, for example, due at least to a relaxation on an electric field in the accumulation area 234.

In some demonstrative embodiments, the multi-split gate configuration of MOS transistor 210 may enable a reduced gate to drain capacitance, e.g., a reduced Cgd capacitance, which may result in reduced switching losses.

Referring back to FIG. 1, in some demonstrative embodiments, the at least first and second field plate gate components of multi-split gate 120 may be connected to one or more supply voltages, for example, according to a second implementation, e.g., as described below.

In some demonstrative embodiments, the first field plate gate component 124 may be connected to a predefined voltage, e.g., according to the second implementation.

In one example, first field plate gate component 124 may be connected to a constant power source, e.g., a 5V power source.

In some demonstrative embodiments, the second field plate gate component 126 may be connected to the VSS voltage, e.g., according to the second implementation.

In some demonstrative embodiments, multi-split gate 120 may include at least a third field plate gate component 128, for example, between the second field plate gate component 126 and the drain 114, e.g., in addition to field plate gate components 124 and 126, for example, according to the second implementation.

In some demonstrative embodiments, third field plate gate component 128 may be connected to the drain 114 of the MOS transistor 110, e.g., according to the second implementation.

In some demonstrative embodiments, third field plate gate component 128 may include, for example, a polysilicon or a metal electrode, e.g., as described above.

In some demonstrative embodiments, MOS transistor 110 may include at least a third isolator 127 configured to electrically isolate between the third field plate gate component 128 and the second field plate gate component 126, e.g., as described above.

Figure 3:
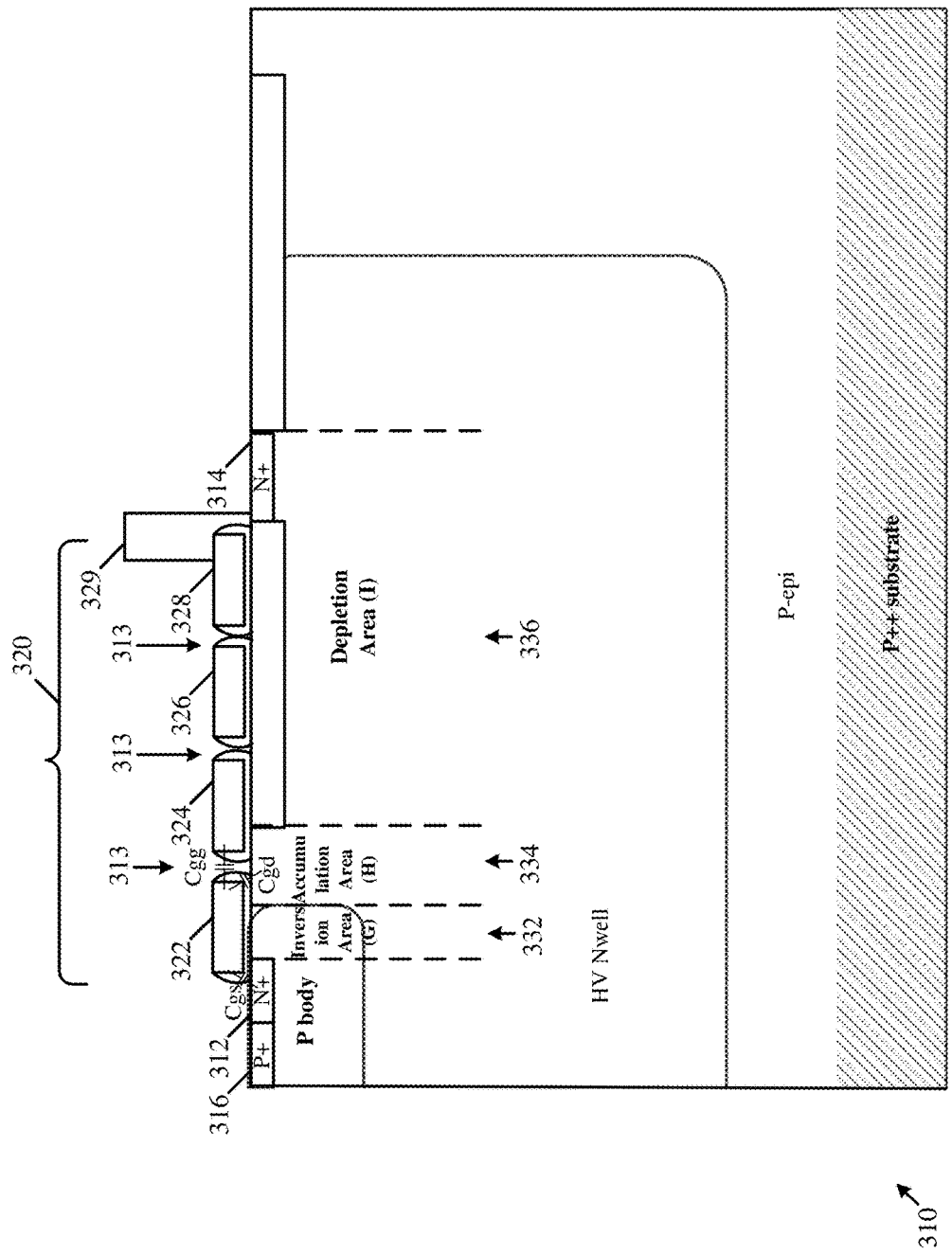
FIG. 3 is a schematic illustration of a cross section of a MOS transistor according to a second implementation, in accordance with some demonstrative embodiments.

Reference is made to FIG. 3, which schematically illustrates a cross section of a MOS transistor 310 according to a second implementation, in accordance with some demonstrative embodiments. For example, MOS transistor 310 may perform the functionality of MOS transistor 110 (FIG. 1).

In some demonstrative embodiments, as shown in FIG. 3, MOS transistor 310 may include a body 316, a source 312, a drain 314, and/or a multi-split gate 320. For example, body 316 may perform the functionality of body 110 (FIG. 1), source 312 may perform the functionality of source 113 (FIG. 1), drain 314 may perform the functionality of drain 114 (FIG. 1), and/or multi-split gate 320 may perform the functionality of multi-split gate 120 (FIG. 1), for example, according to the second implementation.

In some demonstrative embodiments, as shown in FIG. 3, multi-split gate 320 may include a control gate component 322 configured to control the conductivity of the MOS transistor 310, for example, by creating a channel in an inversion region 332 of the MOS transistor 310. For example, control gate component 322 may perform the functionality of control gate component 122 (FIG. 1).

In some demonstrative embodiments, as shown in FIG. 3, multi-split gate 320 may include a first field plate gate component 324 connected to a predefined voltage, e.g., a constant 5V power source. For example, first field plate gate component 324 may perform the functionality of first field plate gate component 124 (FIG. 1).

In some demonstrative embodiments, as shown in FIG. 3, first field plate gate component 324 may be over an accumulation area 334 of MOS transistor 310.

In some demonstrative embodiments, as shown in FIG. 3, multi-split gate 320 may include a second field plate gate component 324 connected to the VSS voltage. For example, second field plate gate component 326 may perform the functionality of second field plate gate component 126 (FIG. 1).

In some demonstrative embodiments, as shown in FIG. 3, multi-split gate 320 may include a third field plate gate component 328, for example, between the second field plate gate component 326 and the drain 314, e.g., in addition to field plate gate components 324 and 326.

In some demonstrative embodiments, as shown in FIG. 3, second field plate gate component 326 and/or third field plate gate component 328 may be over a depletion area 334 of MOS transistor 310.

In some demonstrative embodiments, as shown in FIG. 3, third field plate gate component 328 may be connected (329) to the drain 314 of the MOS transistor 310.

In some demonstrative embodiments, as shown in FIG. 3, MOS transistor 310 may include three or more isolators 313 configured to electrically isolate between gate components 322, 324, 326 and/or 328. For example, isolators 313 may perform the functionality of isolators 123, 125 and/or 127 (FIG. 1).

In some demonstrative embodiments, MOS transistor 310 may provide one or more advantages, e.g., in addition to or instead of the one or more advantages of MOS transistor 210 (FIG. 2), e.g., the reduced Rdson resistance, the increased BVdss voltage, and/or the reduced switching losses.

In some demonstrative embodiments, connecting third field plate gate component 328 to the drain 314 may enable, for example, to increase a snapback of MOS transistor 310 at the On-state.

In some demonstrative embodiments, an increased snapback may be achieved, for example, since third field plate gate component 328 may be in the same potential as drain 314, which may result in a relaxation of an electric field near a drain area of drain 314.

In some demonstrative embodiments, the increased snapback may increase the Rdson resistance, which, in turn, may reduce conduction and/or may increase switching losses. However, the increase in the Rdson resistance may be very small.

Referring back to FIG. 1, in some demonstrative embodiments, the at least first and second field plate gate components of multi-split gate 120 may be connected to one or more supply voltages, for example, according to a third implementation, e.g., as described below.

In some demonstrative embodiments, the first field plate gate component 124 may be shortened to the body 116 of the MOS transistor 110, e.g., according to the third implementation.

In one example, the first field plate gate component 124 may be shortened to the substrate, e.g., under the first field plate gate component 124, for example, to enable a minimal voltage drop between first field plate gate component 124 and the body 116, e.g., to reduce an overall drain capacitance.

In some demonstrative embodiments, the second field plate gate component 126 may be connected to the VSS voltage, for example, to enable an increased BVdss voltage at the Off-state of MOS transistor 110, e.g., according to the third implementation.

Figure 4:
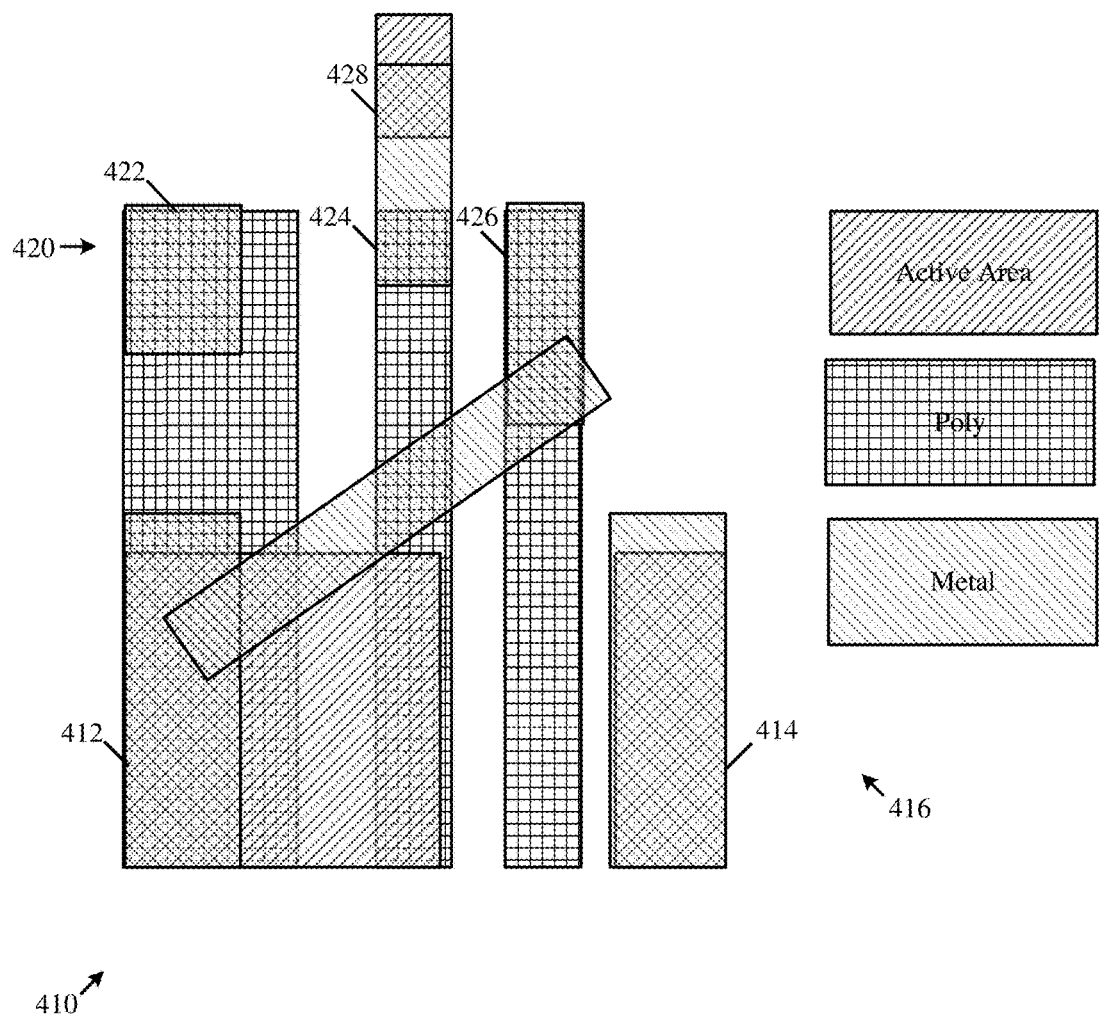
FIG. 4 is a schematic illustration of a top-view of a MOS transistor according to a third implementation, in accordance with some demonstrative embodiments.

Reference is made to FIG. 4, which schematically illustrates a top view of a MOS transistor 410 according to a third implementation, in accordance with some demonstrative embodiments. For example, MOS transistor 410 may perform the functionality of MOS transistor 110 (FIG. 1).

In some demonstrative embodiments, as shown in FIG. 4, MOS transistor 410 may include a body 416, a source 412, a drain 414, and/or a multi-split gate 420. For example, body 416 may perform the functionality of body 110 (FIG. 1), source 412 may perform the functionality of source 113 (FIG. 1), drain 414 may perform the functionality of drain 114 (FIG. 1), and/or multi-split gate 420 may perform the functionality of multi-split gate 120 (FIG. 1), for example, according to the third implementation.

In some demonstrative embodiments, as shown in FIG. 4, multi-split gate 420 may include a control gate component 422 configured to control the conductivity of the MOS transistor 410, for example, by creating a channel in an inversion region of the MOS transistor 410. For example, control gate component 422 may perform the functionality of control gate component 122 (FIG. 1).

In some demonstrative embodiments, as shown in FIG. 4, multi-split gate 420 may include a first field plate gate component 424 shortened (428) to body 416, e.g., under first field plate gate component 424. For example, first field plate gate component 424 may perform the functionality of first field plate gate component 124 (FIG. 1).

In one example, shorting the first field plate gate component 424 to the body 416 may allow, for example, a minimal voltage drop between first field plate gate component 424 and the body 416, e.g., to reduce an overall drain capacitance.

In some demonstrative embodiments, as shown in FIG. 4, multi-split gate 420 may include a second field plate gate component 426 connected to the VSS voltage. For example, second field plate gate component 426 may perform the functionality of second field plate gate component 126 (FIG. 1).

In one example, the second field plate gate component 426 may be connected to the VSS voltage, for example, to enable an increased BVdss at the Off-state of MOS transistor 410.

In some demonstrative embodiments, MOS transistor 410 may provide one or more advantages of the of MOS transistor 210 (FIG. 2), for example, the reduced Rdson resistance, the increased BVdss voltage, and/or the reduced switching losses, e.g., as described above.

Referring back to FIG. 1, in some demonstrative embodiments, the at least first and second field plate gate components of multi-split gate 120 may be connected to one or more supply voltages, for example, according to a fourth implementation, e.g., as described below.

In some demonstrative embodiments, the first field plate gate component 124 may be connected to a variable voltage, e.g., according to the fourth implementation.

In some demonstrative embodiments, IC 102 may include a voltage controller 150 configured to control a voltage of first field plate gate component 124, for example, based on a conductivity state of the MOS transistor 110, e.g., according to the fourth implementation.

In some demonstrative embodiments, voltage controller 150 may include a fast dynamic controller configured to control the voltage of first field plate gate component 124. In other embodiments, voltage controller 150 may include any other dynamic voltage supply.

In some demonstrative embodiments, voltage controller 150 may be configured to provide a first voltage to the first field plate gate component 124, for example, when the MOS transistor 110 is at the On-state.

In some demonstrative embodiments, voltage controller 150 may be configured to provide a second voltage to the first field plate gate component 124, for example, when the MOS transistor 110 is in an Off-state.

In some demonstrative embodiments, voltage controller 150 may be configured to provide a third voltage to the first field plate gate component 124, for example, when the MOS transistor 110 is in a Transient-state, e.g., when switching between the on state and the off state.

In some demonstrative embodiments, the first, second and third voltages may be different from one another, e.g., as described below.

In some demonstrative embodiments, the second field plate gate component 126 may be connected to the VSS voltage, for example, to enable an increased BVdss at the Off-state of MOS transistor 110, e.g., according to the fourth implementation.

Figure 5:
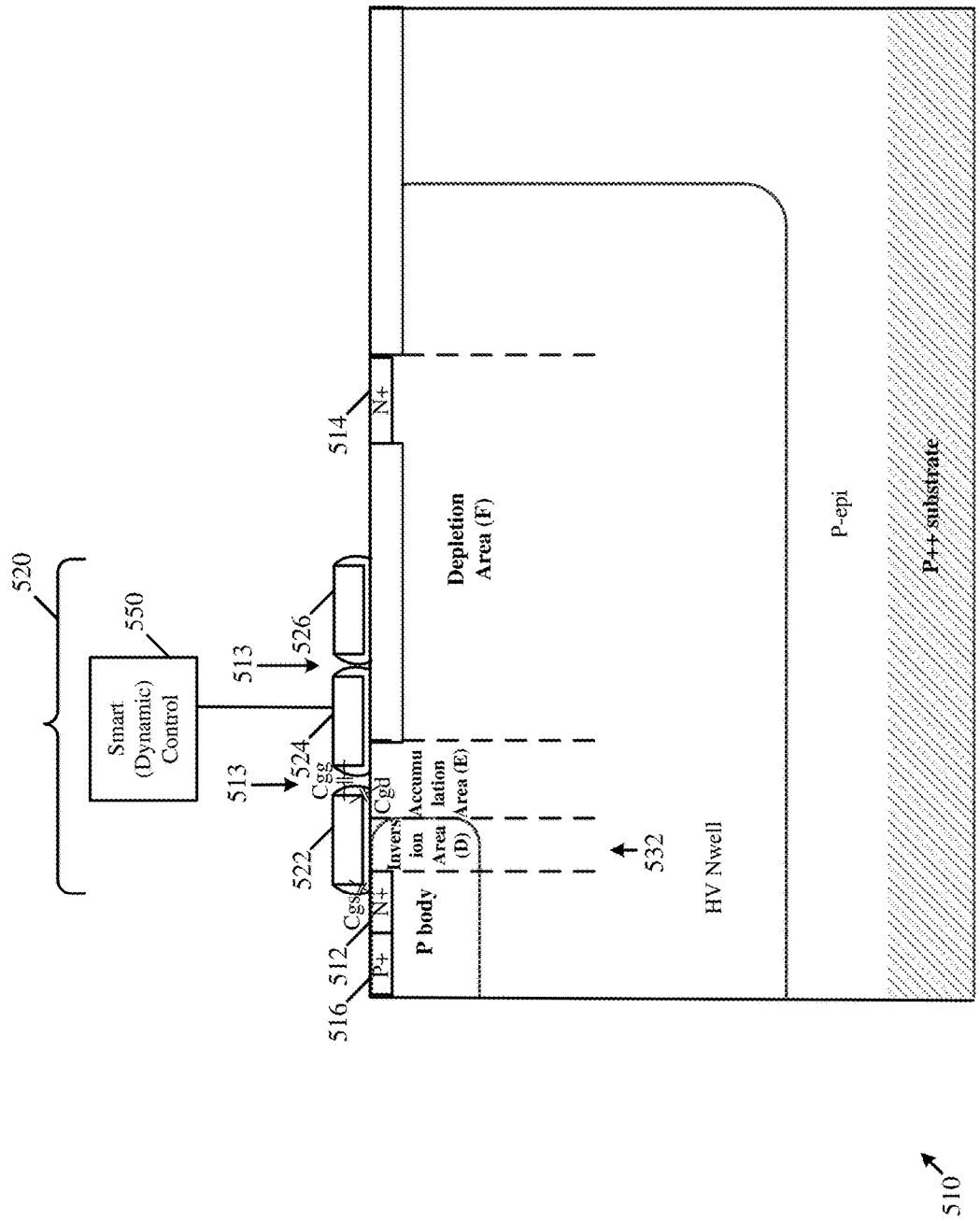
FIG. 5 is a schematic illustration of a cross section of a MOS transistor according to a fourth implementation, in accordance with some demonstrative embodiments.

Reference is made to FIG. 5, which schematically illustrates a cross section of a MOS transistor 510 according to a fourth implementation, in accordance with some demonstrative embodiments. For example, MOS transistor 510 may perform the functionality of MOS transistor 110 (FIG. 1).

In some demonstrative embodiments, as shown in FIG. 5, MOS transistor 510 may include a body 516, a source 512, a drain 514, and/or a multi-split gate 520. For example, body 516 may perform the functionality of body 110 (FIG. 1), source 512 may perform the functionality of source 113 (FIG. 1), drain 514 may perform the functionality of drain 114 (FIG. 1), and/or multi-split gate 520 may perform the functionality of multi-split gate 120 (FIG. 1), for example, according to the fourth implementation.

In some demonstrative embodiments, as shown in FIG. 5, multi-split gate 520 may include a control gate component 522 configured to control the conductivity of the MOS transistor 510, for example, by creating a channel in an inversion region of the MOS transistor 510. For example, control gate component 522 may perform the functionality of control gate component 122 (FIG. 1).

In some demonstrative embodiments, as shown in FIG. 5, multi-split gate 520 may include a first field plate gate component 524 connected to a voltage controller 550, which may be configured to supply a variable voltage to first field plate gate component 524, for example, based on a conductivity state of the MOS transistor 510, e.g., according to the fourth implementation. For example, first field plate gate component 524 may perform the functionality of first field plate gate component 124 (FIG. 1).

In some demonstrative embodiments, as shown in FIG. 5, multi-split gate 520 may include a second field plate gate component 526 connected to the VSS voltage. For example, second field plate gate component 526 may perform the functionality of second field plate gate component 126 (FIG. 1).

In one example, the second field plate gate component 526 may be connected to the VSS voltage, for example, to enable an increased BVdss at the Off-state of MOS transistor 510.

In some demonstrative embodiments, MOS transistor 510 may provide one or more advantages of the MOS transistor 210 (FIG. 2) in the conductive and/or non-conductive states, for example, the reduced Rdson resistance, the increased BVdss voltage, and or the reduced switching losses, e.g., as described above.

Referring back to FIG. 1, in some demonstrative embodiments, MOS transistor 110 may include any other multi-split gate 120 configuration having a control gate component, e.g., control gate component 122, and two or more field plate gate components, for example, according to an implementation different from the first, second, third and/or fourth implementations.

In some demonstrative embodiments, following is a comparison between characteristics of four MOS transistors, e.g., a unified-gate MOS transistor, a two-gate-component MOS transistor, a multi-split gate MOS transistor according to the first implementation, e.g., MOS transistor 200 (FIG. 2), and a multi-split gate MOS transistor according to the second implementation, e.g., MOS transistor 300 (FIG. 3):

TABLE 1

| Device | Vt [V] | Rdson [mΩ · mm2] | Ron [KΩ · um] | BVdss [V] | Snapback [V] | C [fF · um] | R · C [pSec] | RC Ratio |
|---|---|---|---|---|---|---|---|---|
| unified-gate | 0.565 | 13.86 | 4.99 | 34.22 | 29.11 | 1.218 | 6.07 | 100% |
| two-gate-components | 0.567 | 18.45 (+33%) | 6.64 | 36.49 (+6%) | 32 | 0.458 (37%) | 3.04 | 50% |
| Multi Gate - 3 splits | 0.57 | 15.4 (+11%) | 5.54 | 42.41 (+24%) | 30.41 | 0.463 (38%) | 2.56 | 42% |
| Multi Gate - 4 splits | 0.57 | 15.64 (+13%) | 5.63 | 41.14 (+20%) | 33.5 | 0.463 (38%) | 2.6 | 43% |

For example, as shown in Table 1, the MOS transistors may be characterized according to a triggering voltage, (Vt), the Rdson resistance, an on-state resistance (Ron), the BVdss, a snapback, a capacitance (C), a resistance-capacitance (RC), and/or am RC ratio.

The values presented in Table 1 are exemplary values, which may be achieved in an exemplary implementation. In other embodiments, the multi-split gate MOS transistors may be configured to achieve any one or more other characteristic values.

Figure 6:
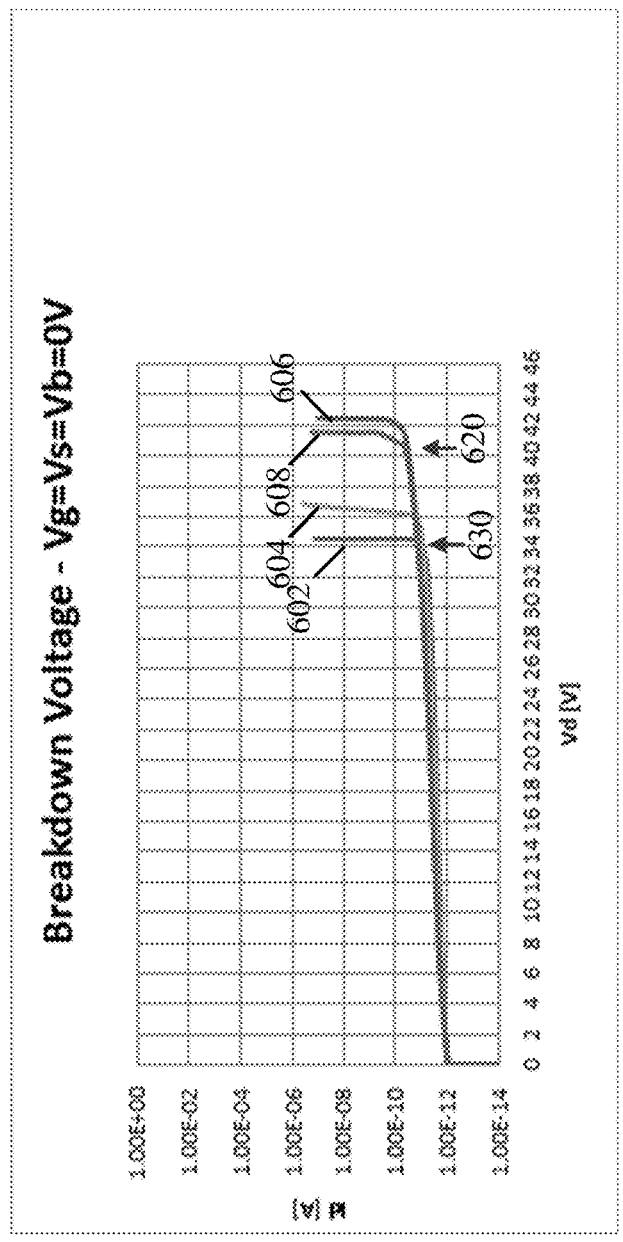
FIG. 6 is a schematic illustration of a graph depicting four curves of a drain current versus a drain voltage corresponding to four respective MOS transistors, in accordance with some demonstrative embodiments.

Reference is made to FIG. 6, which schematically illustrates a graph 600 depicting four curves of a drain current (Id) versus a drain voltage (Vd) corresponding to four respective MOS transistors, in accordance with some demonstrative embodiments.

In one example, the drain current versus the drain voltage may be measured for a MOS transistor, for example, when a gate voltage of the MOS transistor is equal to zero, and a source voltage and a body voltage of the MOS transistor are grounded, e.g., at the off-state of the MOS transistor.

In some demonstrative embodiments, as shown in FIG. 6, a first curve 602 may correspond to a first MOS transistor, e.g., unified-gate MOS transistor.

In some demonstrative embodiments, as shown in FIG. 6, a second curve 604 may correspond to a second MOS transistor, e.g., two-gate-component MOS transistor.

In some demonstrative embodiments, as shown in FIG. 6, a third curve 606 may correspond to a third MOS transistor, e.g., first multi-split gate MOS transistor according to the first implementation, e.g., MOS transistor 200 (FIG. 2).

In some demonstrative embodiments, as shown in FIG. 6, a fourth curve 608 may correspond to a fourth MOS transistor, e.g., a second multi-split gate MOS transistor according to the second implementation, e.g., MOS transistor 300 (FIG. 3).

In some demonstrative embodiments, as shown in FIG. 6, a breakdown voltage 620 of the third and fourth MOS transistors is higher than a breakdown voltage 630 of the first and second MOS transistors. This increased breakdown voltage 620 may enable using increased voltages, e.g., even without increasing a size of a MOS transistor.

Figure 7:
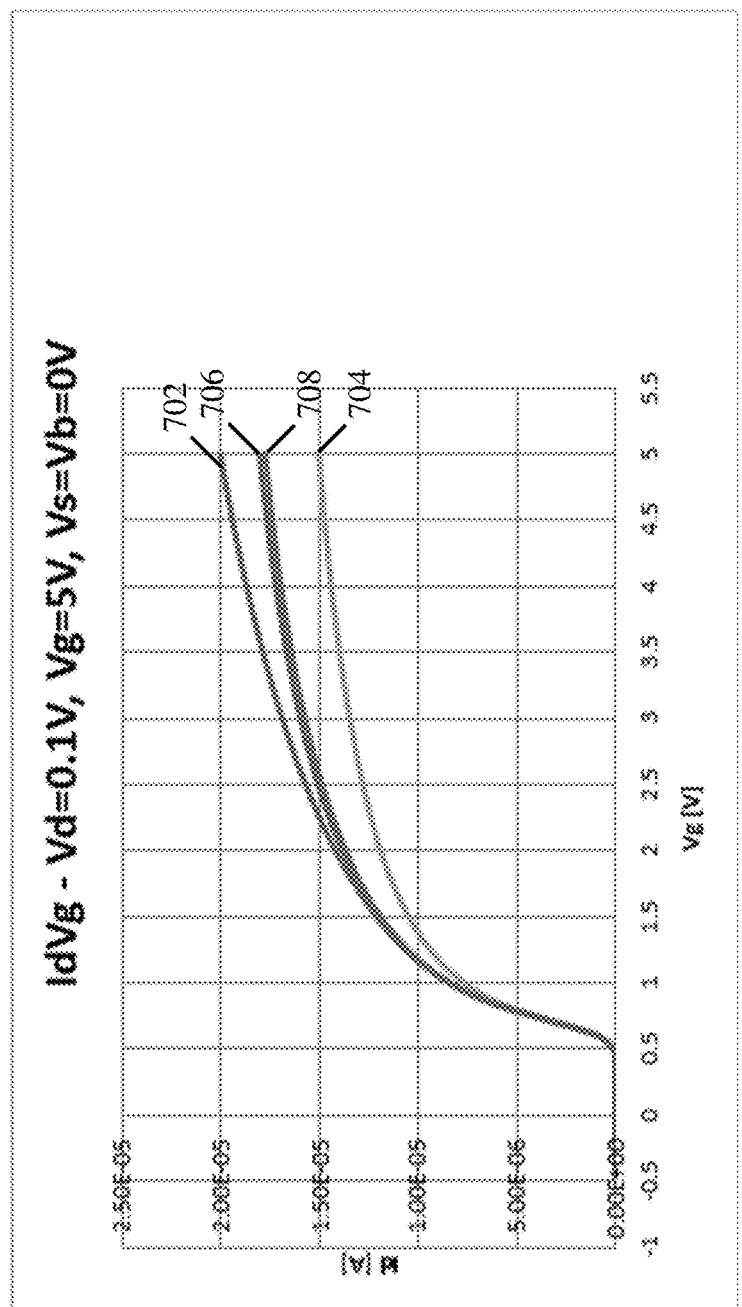
FIG. 7 is a schematic illustration of a graph depicting four curves of a drain current versus a gate voltage corresponding to four respective MOS transistors, in accordance with some demonstrative embodiments.

Reference is made to FIG. 7, which schematically illustrates a graph 700 depicting four curves of a drain current (Id) versus a gate voltage (Vg) of four respective MOS transistors, in accordance with some demonstrative embodiments.

In one example, the drain current versus the gate voltage may be measured for a MOS transistor, for example, when a drain voltage of the MOS transistor is equal to 0.1V, a gate voltage is equal to 5V, and a source voltage and a body voltage of the MOS transistor are grounded.

In some demonstrative embodiments, as shown in FIG. 7, a first curve 702 may correspond to a first MOS transistor, e.g., unified-gate MOS transistor.

In some demonstrative embodiments, as shown in FIG. 7, a second curve 704 may correspond to a second MOS transistor, e.g., two-gate-component MOS transistor.

In some demonstrative embodiments, as shown in FIG. 7, a third curve 706 may correspond to a third MOS transistor, e.g., first multi-split gate MOS transistor according to the first implementation, e.g., MOS transistor 200 (FIG. 2).

In some demonstrative embodiments, as shown in FIG. 7, a fourth curve 708 may correspond to a fourth MOS transistor, e.g., a second multi-split gate MOS transistor according to the second implementation, e.g., MOS transistor 300 (FIG. 3).

In some demonstrative embodiments, as shown in FIG. 7, drain current values of the third and fourth MOS transistors are between the drain current values of the first and second MOS transistors, e.g., in a first field plate voltage of 5V.

Figure 8:
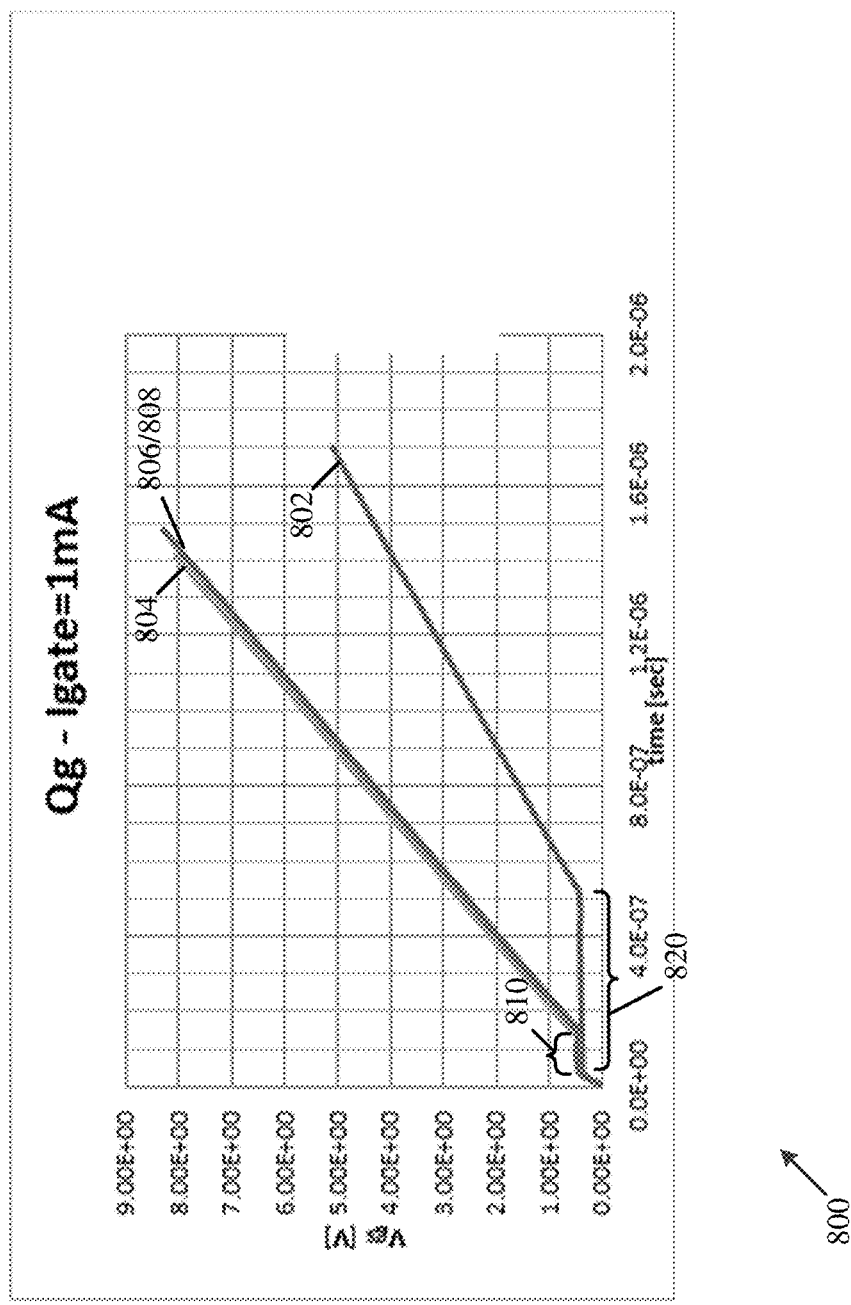
FIG. 8 is a schematic illustration of a graph depicting four curves of a gate-source voltage versus time corresponding to four respective MOS transistors, in accordance with some demonstrative embodiments.

Reference is made to FIG. 8, which schematically illustrates a graph 800 depicting four curves of a gate-source voltage (Vgs) of four respective MOS transistors versus time, in accordance with some demonstrative embodiments.

In one example, a curve of the gate-source voltage versus time may represent a gate charge (Qg) of a MOS transistor, which may be measured, for example, when a gate current (Igate) is equal to one milliAmpere (mA).

In some demonstrative embodiments, as shown in FIG. 8, a first curve 802 may correspond to a first MOS transistor, e.g., unified-gate MOS transistor.

In some demonstrative embodiments, as shown in FIG. 8, a second curve 804 may correspond to a second MOS transistor, e.g., two-gate-component MOS transistor.

In some demonstrative embodiments, as shown in FIG. 8, a third curve 806 may correspond to a third MOS transistor, e.g., first multi-split gate MOS transistor according to the first implementation, e.g., MOS transistor 200 (FIG. 2).

In some demonstrative embodiments, as shown in FIG. 8, a fourth curve 808 may correspond to a fourth MOS transistor, e.g., a second multi-split gate MOS transistor according to the second implementation, e.g., MOS transistor 300 (FIG. 3).

In some demonstrative embodiments, as shown in FIG. 8, a switching time of the fourth MOS transistor is lower than a switching time of the first unified-gate MOS transistor.

In some demonstrative embodiments, as shown in FIG. 8, a length of a portion 810 ("the plateau part") of graphs 804, 806 and/or 808, in which the gate-source voltage does not increase, may be significantly shorter compared to a length of a portion 820 of graph 802, e.g., the plateau part of graph 802.

In some demonstrative embodiments, an energy loss of a MOS transistor, which may result from high current and voltage between a drain and a source of the MOS transistor, may be the highest at portions 810 and 820. Accordingly, a short length of portion 810 may result in reduced energy loss, which may enable reducing switching losses of the MOS transistor.

Figure 9:
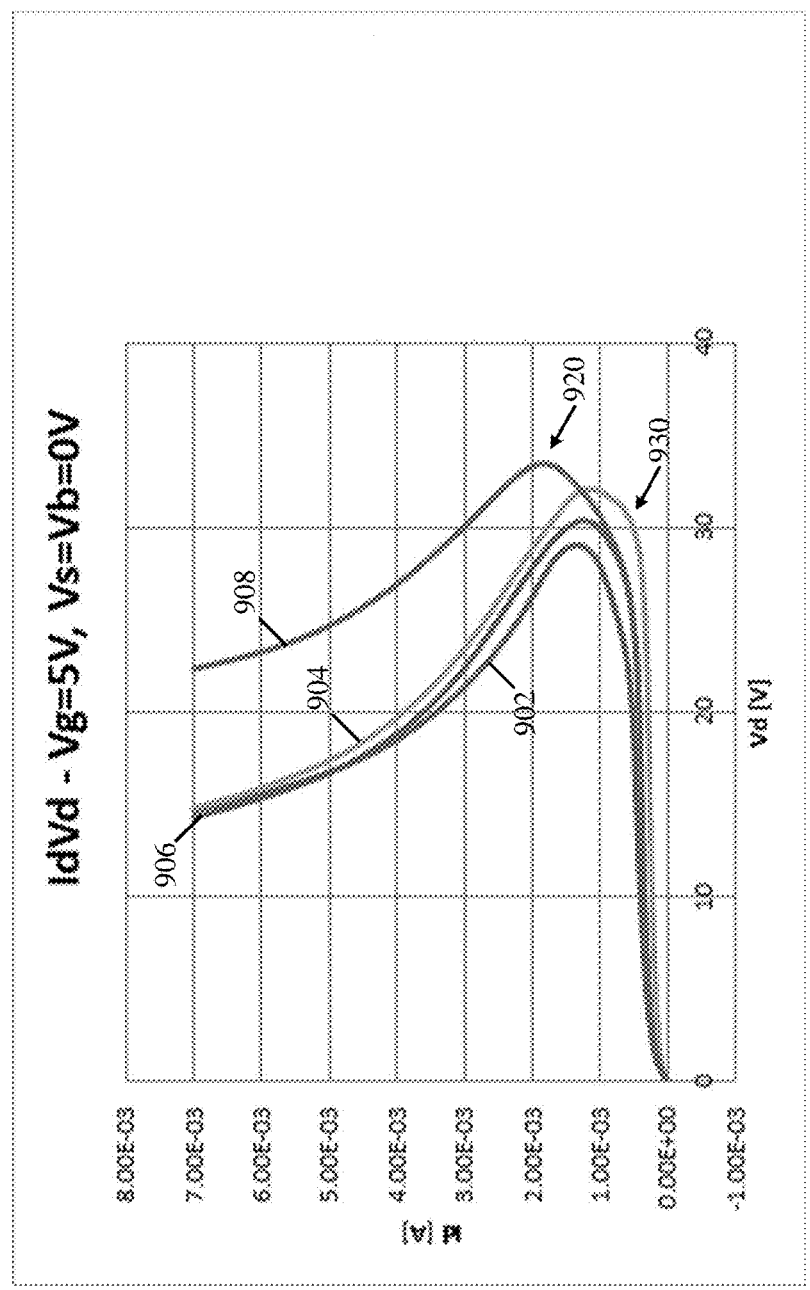
FIG. 9 is a schematic illustration of a graph depicting four curves of a drain current versus a drain voltage corresponding to four respective MOS transistors, in accordance with some demonstrative embodiments.

Reference is made to FIG. 9, which schematically illustrates a graph 900 depicting four curves of a drain current (Id) versus a drain voltage (Vd) of four respective MOS transistors, in accordance with some demonstrative embodiments.

In one example, the drain current versus the drain voltage may be measured for a MOS transistor, for example, when a gate voltage of the MOS transistor is 5V, and a source voltage and a body voltage of the MOS transistor are grounded.

In some demonstrative embodiments, as shown in FIG. 9, a first curve 902 may correspond to a first MOS transistor, e.g., unified-gate MOS transistor.

In some demonstrative embodiments, as shown in FIG. 9, a second curve 904 may correspond to a second MOS transistor, e.g., two-gate-component MOS transistor.

In some demonstrative embodiments, as shown in FIG. 9, a third curve 906 may correspond to a third MOS transistor, e.g., first multi-split gate MOS transistor according to the first implementation, e.g., MOS transistor 200 (FIG. 2).

In some demonstrative embodiments, as shown in FIG. 9, a fourth curve 908 may correspond to a fourth MOS transistor, e.g., a second multi-split gate MOS transistor according to the second implementation, e.g., MOS transistor 300 (FIG. 3).

In some demonstrative embodiments, as shown in FIG. 9, a snapback voltage 920 of the fourth MOS transistor, e.g., corresponding to fourth curve 904, is higher than a snapback voltage 930 of the first, second, and third transistors. This increased snapback voltage may enable, for example, using increased voltages for the fourth MOS transistor.

Figure 10:
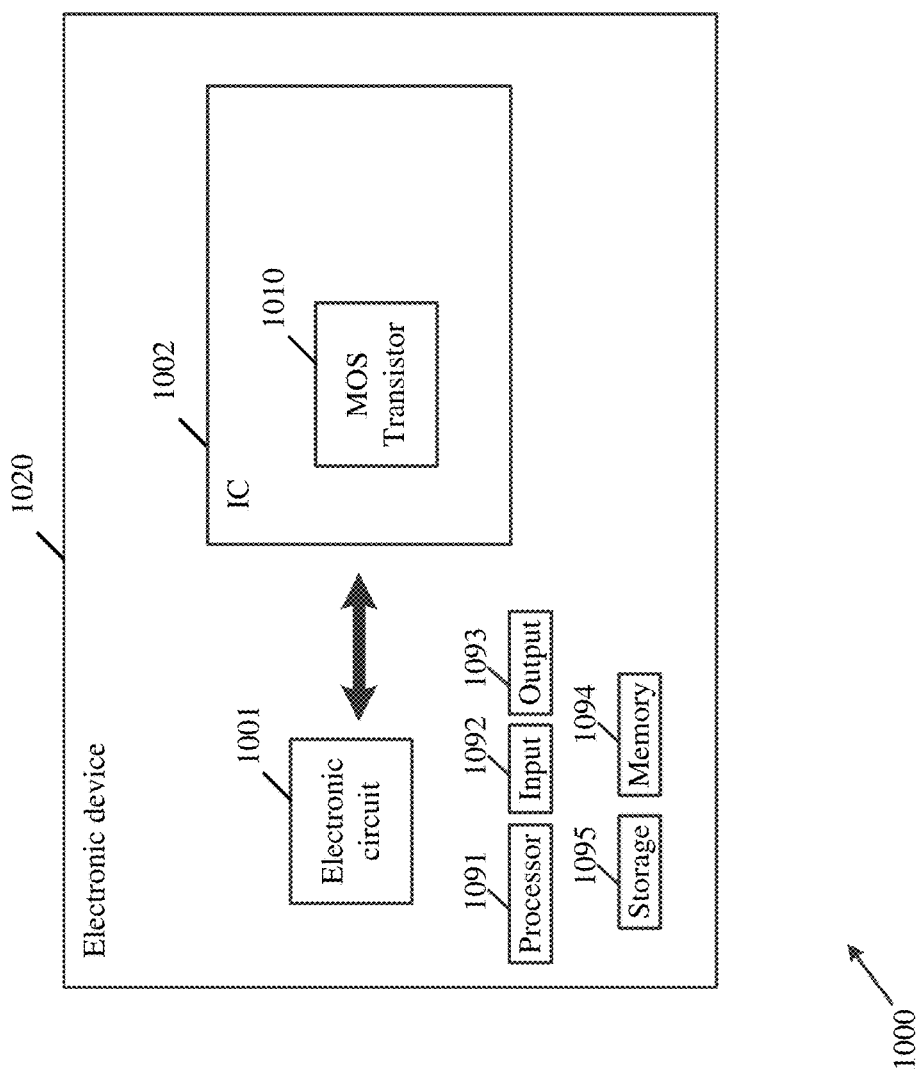
FIG. 10 is a schematic block diagram illustration of an electronic device, in accordance with some demonstrative embodiments.

Reference is made to FIG. 10, which schematically illustrates a block diagram of an electronic device 1000, in accordance with some demonstrative embodiments.

In some demonstrative embodiments, electronic device 1000 may include, for example, a computing device, an electrical device, a mobile device, a mobile phone, a Smartphone, a mobile computer, a laptop computer, a notebook computer, a tablet computer, a handheld computer, an Internet of Things (IoT) device, a sensor device, a handheld device, a wearable device, a gaming device, digital camera, a media player, a music player, or the like.

In some demonstrative embodiments, electronic device 1000 may include an electronic circuit 1001 configured to perform one more functionalities of electronic device 1000.

In some demonstrative embodiments, electronic device 1000 may include an Integrated Circuit (IC) 1002 configured to manage power of electronic circuit 1001.

In some demonstrative embodiments, IC 1002 may include a MOS IC formed on a wafer.

In some demonstrative embodiments, IC 1002 may include a PMIC configured to manage the power of electronic circuit 101.

In some demonstrative embodiments, IC 1002 may be included, and/or may be implemented, as part of electronic circuit 1001.

In one example, electronic circuit 1001 may include a SoC including IC 1002.

In some demonstrative embodiments, IC 1002 and electronic circuit 1001 may be implemented as separate elements of device 1002.

In one example, electronic device 1000 may include an electronic circuit board including IC 1002 and electronic circuit 1001, which may be connected using one or more interconnectors, tracers, and/or wires.

In some demonstrative embodiments, electronic device 1000 may also include, for example, one or more of a processor 1091, an input unit 1092, an output unit 1093, a memory unit 1094, and/or a storage unit 1095. Electronic device 1000 may optionally include other suitable hardware components and/or software components. In some demonstrative embodiments, some or all of the components of one or more of electronic device 1000 may be enclosed in a common housing or packaging, and may be interconnected or operably associated using one or more wired or wireless links.

In some demonstrative embodiments, processor 1091 may include, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. Processor 1091 may execute instructions, for example, of an Operating System (OS) of electronic device 1000 and/or of one or more suitable applications.

In some demonstrative embodiments, input unit 1092 may include, for example, a keyboard, a keypad, a mouse, a touch-screen, a touch-pad, a track-ball, a stylus, a microphone, or other suitable pointing device or input device. Output unit 1093 may include, for example, a monitor, a screen, a touch-screen, a flat panel display, a Light Emitting Diode (LED) display unit, a Liquid Crystal Display (LCD) display unit, a plasma display unit, one or more audio speakers or earphones, or other suitable output devices.

In some demonstrative embodiments, memory unit 1094 may includes, for example, a Random Access Memory (RAM), a Read Only Memory (ROM), a Dynamic RAM (DRAM), a Synchronous DRAM (SD-RAM), a flash memory, a volatile memory, a non-volatile memory, a cache memory, a buffer, a short term memory unit, a long term memory unit, or other suitable memory units. Storage unit 1095 may include, for example, a hard disk drive, a floppy disk drive, a Compact Disk (CD) drive, a CD-ROM drive, a DVD drive, or other suitable removable or non-removable storage units. Memory unit 1094 and/or storage unit 1095, for example, may store data processed by electronic device 1000.

EXAMPLES

The following examples pertain to further embodiments.

Example 1 includes an Integrated Circuit (IC) comprising at least one metal-oxide-semiconductor (MOS) transistor, the MOS transistor comprising a source; a drain; a body; and a multi-split gate comprising a control gate component configured to control conductivity of the MOS transistor, and at least first and second field plate gate components, the first field plate gate component is electrically isolated from the second field plate gate component, the first and second field plate gate components are electrically isolated from the control gate.

Example 2 includes the subject matter of Example 1, and optionally, wherein the first field plate gate component is connected to a predefined voltage.

Example 3 includes the subject matter of Example 2, and optionally, wherein the second field plate gate component is connected to a source supply voltage (VSS).

Example 4 includes the subject matter of Example 2 or 3, and optionally, wherein the second field plate gate component is between the drain and the first field plate gate component.

Example 5 includes the subject matter of Example 1, and optionally, wherein the multi-split gate comprises at least a third field plate gate component between the second field plate gate component and the drain.

Example 6 includes the subject matter of Example 5, and optionally, wherein the third field plate gate component is connected to the drain of the MOS transistor.

Example 7 includes the subject matter of Example 5 or 6, and optionally, wherein the second field plate gate component is connected to a predefined voltage.

Example 8 includes the subject matter of Example 1, and optionally, wherein the first field plate component is shortened to the body of the MOS transistor.

Example 9 includes the subject matter of Example 8, and optionally, wherein the second field plate gate component is connected to a source supply voltage (VSS).

Example 10 includes the subject matter of Example 8 or 9, and optionally, wherein the second field plate gate component is between the drain and the first field plate gate component.

Example 11 includes the subject matter of Example 1, and optionally, wherein the first field plate gate component is connected to a variable voltage.

Example 12 includes the subject matter of Example 11, and optionally, comprising a voltage controller configured to control the variable voltage based on a conductivity state of the MOS transistor.

Example 13 includes the subject matter of Example 12, and optionally, wherein the voltage controller is configured to provide a first voltage to the first field plate gate component when the MOS transistor is in an On-state, to provide a second voltage to the first field plate gate component when the MOS transistor is in an Off-state, and to provide a third voltage to the first field plate gate component when the MOS transistor is in a Transient-state, the first, second and third voltages are different from one another.

Example 14 includes the subject matter of any one of Examples 11-13, and optionally, wherein the second field plate gate component is connected to a source supply voltage (VSS).

Example 15 includes the subject matter of any one of Examples 1-14, and optionally, wherein the first field plate gate component is over an accumulation area of the MOS transistor.

Example 16 includes the subject matter of any one of Examples 1-15, and optionally, wherein the control gate component is configured to control the conductivity of the MOS transistor by creating a channel in an inversion region of the MOS transistor.

Example 17 includes the subject matter of any one of Examples 1-16, and optionally, wherein the control gate component is over an inversion region of the MOS transistor.

Example 18 includes the subject matter of any one of Examples 1-17, and optionally, wherein the control gate component is between the source and the first field plate gate component.

Example 19 includes the subject matter of any one of Examples 1-18, and optionally, wherein the first and second field plate gate components and the control gate component comprise three respective polysilicon or metal electrodes.

Example 20 includes the subject matter of any one of Examples 1-19, and optionally, wherein the body comprises a P-type body or an N-type body.

Example 21 includes the subject matter of any one of Examples 1-20, and optionally, comprising at least a first isolator to electrically isolate between the first field plate component and the control gate component, and a second isolator to electrically isolate between the first and second field plate gate components.

Example 22 includes the subject matter of any one of Examples 1-21, and optionally, wherein the MOS transistor comprises a lateral Double-Diffused MOS (DMOS), or a vertical DMOS.

Example 23 includes the subject matter of any one of Examples 1-222, and optionally, comprising a Power Management Integrated Circuit (PMIC).

Example 24 includes an electronic device comprising an electronic circuit; and a power management integrated circuit (PMIC) to manage power of the electronic circuit, the PMIC comprising at least one metal-oxide-semiconductor (MOS) transistor, the MOS transistor comprising a source; a drain; a body; and a multi-split gate comprising a control gate component configured to control conductivity of the MOS transistor, and at least first and second field plate gate components, the first field plate gate component is electrically isolated from the second field plate gate component, the first and second field plate gate components are electrically isolated from the control gate.

Example 25 includes the subject matter of Example 24, and optionally, wherein the first field plate gate component is connected to a predefined voltage.

Example 26 includes the subject matter of Example 25, and optionally, wherein the second field plate gate component is connected to a source supply voltage (VSS).

Example 27 includes the subject matter of Example 25 or 26, and optionally, wherein the second field plate gate component is between the drain and the first field plate gate component.

Example 28 includes the subject matter of Example 24, and optionally, wherein the multi-split gate comprises at least a third field plate gate component between the second field plate gate component and the drain.

Example 29 includes the subject matter of Example 28, and optionally, wherein the third field plate gate component is connected to the drain of the MOS transistor.

Example 30 includes the subject matter of Example 28 or 29, and optionally, wherein the second field plate gate component is connected to a predefined voltage.

Example 31 includes the subject matter of Example 24, and optionally, wherein the first field plate component is shortened to the body of the MOS transistor.

Example 32 includes the subject matter of Example 31, and optionally, wherein the second field plate gate component is connected to a source supply voltage (VSS).

Example 33 includes the subject matter of Example 31 or 32, and optionally, wherein the second field plate gate component is between the drain and the first field plate gate component.

Example 34 includes the subject matter of Example 24, and optionally, wherein the first field plate gate component is connected to a variable voltage.

Example 35 includes the subject matter of Example 34, and optionally, comprising a voltage controller configured to control the variable voltage based on a conductivity state of the MOS transistor.

Example 36 includes the subject matter of Example 35, and optionally, wherein the voltage controller is configured to provide a first voltage to the first field plate gate component when the MOS transistor is in an On-state, to provide a second voltage to the first field plate gate component when the MOS transistor is in an Off-state, and to provide a third voltage to the first field plate gate component when the MOS transistor is in a Transient-state, the first, second and third voltages are different from one another.

Example 37 includes the subject matter of any one of Examples 34-36, and optionally, wherein the second field plate gate component is connected to a source supply voltage (VSS).

Example 38 includes the subject matter of any one of Examples 24-37, and optionally, wherein the first field plate gate component is over an accumulation area of the MOS transistor.

Example 39 includes the subject matter of any one of Examples 24-38, and optionally, wherein the control gate component is configured to control the conductivity of the MOS transistor by creating a channel in an inversion region of the MOS transistor.

Example 40 includes the subject matter of any one of Examples 24-39, and optionally, wherein the control gate component is over an inversion region of the MOS transistor.

Example 41 includes the subject matter of any one of Examples 24-40, and optionally, wherein the control gate component is between the source and the first field plate gate component.

Example 42 includes the subject matter of any one of Examples 24-41, and optionally, wherein the first and second field plate gate components and the control gate component comprise three respective polysilicon or metal electrodes.

Example 43 includes the subject matter of any one of Examples 24-42, and optionally, wherein the body comprises a P-type body or an N-type body.

Example 44 includes the subject matter of any one of Examples 24-43, and optionally, wherein the PMIC comprises at least a first isolator to electrically isolate between the first field plate component and the control gate component, and a second isolator to electrically isolate between the first and second field plate gate components.

Example 45 includes the subject matter of any one of Examples 24-44, and optionally, wherein the MOS transistor comprises a lateral Double-Diffused MOS (DMOS), or a vertical DMOS.

Functions, operations, components and/or features described herein with reference to one or more embodiments, may be combined with, or may be utilized in combination with, one or more other functions, operations, components and/or features described herein with reference to one or more other embodiments, or vice versa.

While certain features have been illustrated and described herein, many modifications, substitutions, changes, and equivalents may occur to those skilled in the art. It is, therefore, to be understood that the appended claims are intended to cover all such modifications and changes as fall within the true spirit of the disclosure.

What is claimed is:

1. An Integrated Circuit (IC) comprising at least one metal-oxide-semiconductor (MOS) transistor, the MOS transistor comprising:
    a source;
    a drain;
    a body; and
    a multi-split gate comprising a control gate component configured to control conductivity of said MOS transistor, and at least first and second field plate gate components, said first field plate gate component is electrically isolated from said second field plate gate component, said first and second field plate gate components are electrically isolated from said control gate, the control gate component is configured to control the conductivity of said MOS transistor by creating a channel in an inversion region of said MOS transistor, the first field plate gate component is over an accumulation area of said MOS transistor, the second field plate gate component is over a depletion area of said MOS transistor.

2. The IC of claim 1, wherein the first field plate gate component is connected to a predefined voltage.

3. The IC of claim 2, wherein the second field plate gate component is connected to a source supply voltage (VSS).

4. The IC of claim 2, wherein the second field plate gate component is between said drain and said first field plate gate component.

5. The IC of claim 1, wherein the multi-split gate comprises at least a third field plate gate component between said second field plate gate component and said drain.

6. The IC of claim 5, wherein the third field plate gate component is connected to the drain of said MOS transistor.

7. The IC of claim 5, wherein the second field plate gate component is connected to a predefined voltage.

8. The IC of claim 1, wherein the first field plate component is shortened to the body of said MOS transistor.

9. The IC of claim 8, wherein the second field plate gate component is connected to a source supply voltage (VSS).

10. The IC of claim 8, wherein the second field plate gate component is between said drain and said first field plate gate component.

11. The IC of claim 1, wherein the first field plate gate component is connected to a variable voltage.

12. The IC of claim 11 comprising a voltage controller configured to control said variable voltage based on a conductivity state of said MOS transistor.

13. The IC of claim 12, wherein said voltage controller is configured to provide a first voltage to said first field plate gate component when said MOS transistor is in an On-state, to provide a second voltage to said first field plate gate component when said MOS transistor is in an Off-state, and to provide a third voltage to said first field plate gate component when said MOS transistor is in a Transient-state, said first, second and third voltages are different from one another.

14. The IC of claim 11, wherein the second field plate gate component is connected to a source supply voltage (VSS).

15. The IC of claim 1, wherein the control gate component is between said source and said first field plate gate component, the second field plate gate component is between the first field plate gate component and the drain.

16. The IC of claim 1, wherein the control gate component is between said source and said first field plate gate component.

17. The IC of claim 1, wherein the first and second field plate gate components and the control gate component comprise three respective polysilicon or metal electrodes.

18. The IC of claim 1 comprising at least a first isolator to electrically isolate between said first field plate component and said control gate component, and a second isolator to electrically isolate between said first and second field plate gate components.

19. The IC of claim 1, wherein the MOS transistor comprises a lateral Double-Diffused MOS (DMOS), or a vertical DMOS.

20. The IC of claim 1 comprising a Power Management Integrated Circuit (PMIC).

21. An electronic device comprising:
   an electronic circuit; and
   a power management integrated circuit (PMIC) to manage power of said electronic circuit, said PMIC comprising at least one metal-oxide-semiconductor (MOS) transistor, the MOS transistor comprising:
      a source;
      a drain;
      a body; and
      a multi-split gate comprising a control gate component configured to control conductivity of said MOS transistor, and at least first and second field plate gate components, said first field plate gate component is electrically isolated from said second field plate gate component, said first and second field plate gate components are electrically isolated from said control gate, the control gate component is configured to control the conductivity of said MOS transistor by creating a channel in an inversion region of said MOS transistor, the first field plate gate component is over an accumulation area of said MOS transistor, the second field plate gate component is over a depletion area of said MOS transistor.

22. The electronic device of claim 21, wherein the multi-split gate comprises at least a third field plate gate component between said second field plate gate component and said drain.

23. The electronic device of claim 21, wherein the first field plate gate component is connected to a variable voltage.

* * * * *